United States Patent
Suzuki et al.

(10) Patent No.: US 7,439,745 B2
(45) Date of Patent: Oct. 21, 2008

(54) NICKEL-HYDRIDE BATTERY LIFE DETERMINING METHOD AND LIFE DETERMINING APPARATUS

(75) Inventors: Tatsuhiko Suzuki, Osaka (JP); Hiroki Takeshima, Kanagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 21 days.

(21) Appl. No.: 10/587,276

(22) PCT Filed: Aug. 3, 2005

(86) PCT No.: PCT/JP2005/014187

§ 371 (c)(1),
(2), (4) Date: Jul. 25, 2006

(87) PCT Pub. No.: WO2006/013881

PCT Pub. Date: Feb. 9, 2006

(65) Prior Publication Data

US 2007/0164707 A1    Jul. 19, 2007

(30) Foreign Application Priority Data

Aug. 5, 2004    (JP)    ............................ 2004-229251
Oct. 19, 2004   (JP)    ............................ 2004-304121

(51) Int. Cl.
*G01N 27/416* (2006.01)
(52) U.S. Cl. .................. 324/427; 320/132; 324/432
(58) Field of Classification Search .................. 320/132; 324/427, 426, 432
See application file for complete search history.

(56) References Cited

U.S. PATENT DOCUMENTS 6,271,647 B2    8/2001    Galbraith et al.

FOREIGN PATENT DOCUMENTS

JP    5-74501 A    3/1993
JP    8-138759     5/1996

(Continued)

OTHER PUBLICATIONS

Machine Translation for (JP 2000243459 A).*

(Continued)

*Primary Examiner*—Akm Enayet Ullah
*Assistant Examiner*—Ramy Ramadan
(74) *Attorney, Agent, or Firm*—McDermott Will & Emery LLP

(57) ABSTRACT

Data indicating a relationship of life of a battery to a value of load power applied to the battery in discharge and environmental temperature of a place where the battery is installed are prepared beforehand. Next, the load power and the environmental temperature when the battery is discharged are measured, and then a life value corresponding to these measured values is selected from the data so as to be set as an expected life value. Next, a first life reduction amount is calculated from a natural logarithmic function with the number-of-discharges as a variable, and the difference between the expected life value and the first life reduction amount is set to a remaining life value, on the basis of which the life of the nickel-hydride battery is determined. By this method, the life of the nickel-hydride battery as a backup power source can be accurately determined, while correction based on phenomena unique to the nickel-hydride battery is performed.

6 Claims, 4 Drawing Sheets

FOREIGN PATENT DOCUMENTS

| | | |
|---|---|---|
| JP | 2000-12098 A | 1/2000 |
| JP | 2000-215923 | 8/2000 |
| JP | 2000-243459 A | 9/2000 |
| JP | 2000243459 A * | 9/2000 |
| JP | 2003-161768 A | 6/2003 |

OTHER PUBLICATIONS

Chinese Office Action issued in Chinese Patent Application No. CN 2005800053328, mailed Mar. 7, 2008.

* cited by examiner

NICKEL-HYDRIDE BATTERY LIFE DETERMINING METHOD AND LIFE DETERMINING APPARATUS

RELATED APPLICATIONS

This application is the U.S. National Phase under 35 U.S.C. § 371 of International Application No. PCT/JP2005/014187, filed on Aug. 3, 2005, which in turn claims the benefit of Japanese Application Nos. 2004-229251 and 2004-30412 1 filed on Aug. 5, 2004 and Oct. 19, 2004, respectively, the disclosures of which Applications are incorporated by reference herein.

TECHNICAL FIELD

The present invention relates to a life determining method of a nickel-hydride battery used for an uninterruptible power supply and the like, and a life determining apparatus adopting the method, and more particularly to a precise life determining method based on a behavior unique to the nickel-hydride battery.

BACKGROUND ART

In an apparatus incorporating a backup battery such as an uninterruptible power supply (UPS), it is important to detect the life of the battery from the viewpoint of maintenance and inspection. In general, the deterioration of life of a nickel-hydride battery is mainly caused by corrosion of a hydrogen storage alloy of a negative electrode, but is often influenced by such factors as the use temperature, the number-of-discharges, the magnitude of load power in discharge, and the like. In this way, the factors for determining the life of the battery are diversified, and hence, it is not easy to accurately determine the life of the battery in use.

Conventionally, it is proposed to use an increase in the internal resistance at the end of life of the battery and a voltage change in discharge as parameters in order to determine the life of a nickel-hydride battery. For example, there are disclosed an apparatus which performs deterioration determination by calculating a gradient of discharge voltage values based on the distribution of the discharge voltage values corresponding to plural discharge current values (for example, patent document 1), and an apparatus which performs deterioration determination by relatively comparing values of internal resistance and battery voltage which are measured during discharge with their initial values (for example, patent document 2). In these life determination methods, attention is directed to a correlation of the internal resistance of the battery with the resultant voltage change and life of the nickel-hydride battery, and hence, these methods are effective in that it is possible to estimate the life of the battery to some degrees in a short period time.

On the other hand, there is proposed a method in which an expected life value of a battery is calculated from a discharge load power value and in which the difference between the expected life value and a life reduction amount calculated as a linear function with the number-of-discharges as a variable is used as a remaining life value to determine the life of the battery (for example, patent document 3). This method makes it possible to use a highly precise expected life value by suitably correcting the value without forcibly making the battery discharge, and hence, is effective for a lead-acid battery, and the like.

Patent document 1: Japanese Laid-Open Patent Publication No. 8-138759
Patent document 2: Japanese Laid-Open Patent Publication No. 2000-215923
Patent document 3: Japanese Laid-Open Patent Publication No. 2000-243459

DISCLOSURE OF THE INVENTION

Problem to be Solved by the Invention

However, in the methods disclosed in the patent documents 1 and 2, it is impossible to perform the life determination unless the internal resistance is increased to some extent. Further, in the methods, the discharge frequency, the battery temperature and the like which become causes of the life deterioration are not taken into consideration. Further, in the method disclosed in patent document 3, the formula used for the life determination is not a linear function with the number-of-discharges as a variable because of the deterioration behavior (corrosion of the hydrogen storage alloy of the negative electrode) unique to the nickel-hydride battery. For this reason, in any case, there is a problem that the remaining life value is considerably deviated from the actual record value.

The principal object of the invention is to provide a method for accurately determining the life of a nickel-hydride battery and an apparatus adopting the method.

Means for Solving the Problem

A first life determining method of a nickel-hydride battery according to the present invention comprises:

(a) a step of preparing beforehand data representing a relationship of life of the battery to load power applied to the battery in discharge and environmental temperature of a place in which the battery is installed;

(b) a step of measuring the load power and the environmental temperature of the battery in discharge;

(c) a step of selecting a life value corresponding to the measured values of the load power and the environmental temperature from the data to set the life value as an expected life value;

(d) a step of calculating a first life reduction amount from a natural logarithmic function with the number-of-discharges of the battery as a variable; and (e) a step of setting a value obtained by subtracting the first life reduction amount from the expected life value to a remaining life value.

As described above, the main cause of deterioration of life of a nickel-hydride battery is corrosion of a hydrogen storage alloy of a negative electrode. The hydrogen storage alloy is rapidly self pulverized owing to the volumetric change in accordance with storage and discharge of hydrogen in the initial charge and discharge. At this time, corrosion of the hydrogen storage alloy is accelerated, but the corrosion is suppressed in accordance with the settlement of the self pulverization after the number-of-discharges is increased. In contrast to a battery system such as a lead-acid battery in which charge and discharge are repeated by the dissolution and deposition of active materials, the life deterioration as a behavior unique to the nickel-hydride battery is expressed by a natural logarithmic function with the number-of-discharges as a variable.

The present invention, in which attention is directed to this behavior, is to provide a life determining method capable of accurately determining the life of the nickel-hydride battery.

Specifically, when the expected life value is $L_o$, the number-of-discharges is N, the first life reduction amount is $L_1$, and the remaining life value is L, then the first life reduction amount is expressed by the following formula (1), and the remaining life value is expressed by the following formula (2):

$$L_1 = a \times \ln(b \times N) + c \qquad (1)$$

$$L = L_0 - L_1 \qquad (2)$$

where a, b, c are constants, and ln represents the natural logarithmic function.

Since the life reduction amount increases in accordance with the degree of corrosion of the hydrogen storage alloy of the negative electrode, $L_1$ becomes small when the constitution condition of the battery is changed to suppress the corrosion or to reduce the effect of the corrosion. Note that the values of a, b of the constants a, b, c are changed by the constitution of the nickel-hydride battery, for example, by the thickness of the separator, but the value of c is almost constant in the nickel-hydride battery.

A second life determining method according to the present invention is a method capable of more accurately determining the life of a nickel-hydride battery, and in the above described first method, further comprises: a step of calculating an average value of battery temperatures measured at a fixed time interval during charge and discharge or during pause of the charge and discharge; a step of calculating a second life reduction amount from the product of the number-of-discharges and a value of an exponential function with the difference between the average value of battery temperature and the measured value of environmental temperature as a variable; and a step of performing life determination by using a value obtained by subtracting the first and second life reduction amounts from the above described expected life value as a remaining life value.

The life of the nickel-hydride battery is exponentially reduced in accordance with the temperature rise of the battery itself. This is because corrosion of the hydrogen storage alloy is more accelerated under the high temperature than the normal temperature. By adding this factor to the first method according to the present invention, the life of the nickel-hydride battery can be more accurately determined.

Specifically, when the expected life value is $L_0$, the first life reduction amount is $L_1$, the number-of-discharges is N, the average value of the battery temperatures measured at a fixed time interval during charge and discharge or during pause of the charge and discharge is $T_m$, the environmental temperature at the time of calculating the expected life value is $T_0$, the second life reduction amount is $L_2$, and the remaining life value is L, then the second life reduction amount is expressed by the following formula (3), and the remaining life value is expressed by the following formula (4):

$$L_2 = d \times N \times 2^{[(T_m - T_0)/10]} \qquad (3)$$

$$L = L_0 - (L_1 + L_2) \qquad (4)$$

where d is a constant.

Since the second life reduction amount $L_2$ is changed in accordance with the average value of battery temperature, $L_2$ becomes small when the constitution condition of the battery is changed to suppress heat generation and to improve heat dissipation. Note that the constant d is an almost fixed value depending upon the kind of the battery.

A third life determining method according to the present invention is a method capable of more accurately determining the life of a nickel-hydride battery, and in the above described second method, further comprises: a step of calculating a non-periodical expected life value from the product of the initial expected life value and a value of an exponential function with the difference between the measured value of environmental temperature and the average value of battery temperature as a variable; and a step of performing life determination by using a value obtained by subtracting the first and second life reduction amounts from the non-periodical expected life value as a remaining life value.

More strictly, the above described expected life value $L_0$ in the first and second methods (having the same meaning as the initial expected life value) is exponentially changed with the temperature history of the battery. By adding this factor to the second method according to the present invention, the life of the nickel-hydride battery can be more accurately determined.

Specifically, when the initial expected life value is $L_0$, the non-periodical expected life value is $L_m$, the first life reduction amount is $L_1$, the environmental temperature at the time of calculating the initial expected life value is $T_0$, the average value of battery temperature during charge and discharge or during pause of the charge and discharge is $T_m$, the second life reduction amount is $L_2$, and the remaining life value is L, then the non-periodical expected life value is expressed by the following formula (5) and the remaining life value is expressed by the following formula (6).

$$L_m = L_0 \times 2^{[(T_0 - T_m)/10]} \qquad (5)$$

$$L = L_m - (L_1 + L_2) \qquad (6)$$

In the above described third method according to the present invention, in order to calculate a life value from a value of load power applied to a nickel-hydride battery in discharge, data indicating a relationship of life of the battery to load power and environmental temperature are prepared beforehand, and a life value corresponding to measured values of load power and environmental temperature is selected from the data so as to be set as the expected life value, as a result of which the life estimation can be performed more accurately. Further, in the case where the nickel-hydride battery is performing its original backup function owing to real power interruption, correction relating to the battery life deteriorated by the discharge is performed, so that the life of the battery can be more precisely and accurately determined.

Next, a life determining apparatus of a nickel-hydride battery according to the present invention comprises:

storing means which stores data indicating a relationship of life of the battery to load power applied to the battery in discharge and environmental temperature in a place where the battery is installed;

load power measuring means which measures the load power applied to the battery;

environmental temperature measuring means which measures the environmental temperature;

expected life value selecting means which selects as an expected life value, a life value corresponding to the load power and the environmental temperature which are measured, from the data stored in the storing means;

number-of-discharges counting means which counts the number-of-discharges of the battery;

first life reduction amount calculating means which calculates a first life reduction amount from a natural logarithmic function with the number-of-discharges counted by the number-of-discharges counting means as a variable; and remaining life value calculating means which calculates a remaining life value from the difference between the expected life value and the first life reduction amount.

In the above described life determining apparatus according to the present invention, the influence of the backup discharge during power interruption upon the life of the battery can be reflected in the life determination of the battery by utilizing the first life reduction amount.

A life determining apparatus according to the present invention, in addition to the above described constitution, further comprises:

battery temperature measuring means which measures battery temperatures during charge and discharge or during pause of the charge and discharge at a fixed time interval;

average value calculating means which calculates an average value of battery temperature from the measured battery temperatures and the number of measurement; and second life reduction amount calculating means which calculates a second life reduction amount from the product of the number-of-discharges and a value of an exponential function with the difference between the average value of the battery temperature and the environmental temperature as a variable.

In the above described life determining apparatus according to the present invention, the battery temperature can be reflected in the life determination of the battery by calculating the remaining life value from the difference between the expected life value and the first and second life reduction amounts, so that the accuracy of remaining life value can be further improved.

A life determining apparatus according to the present invention, in addition to the above described constitution, further comprises non-periodical expected life value calculating means which selects a life value of battery corresponding to the measured load power and the measured environmental temperature from the data stored in the storing means to set the selected life value as an initial expected life value, and which calculates a non-periodical expected life value from the product of the initial expected life value and a value of an exponential function with the difference between the environmental temperature and the average value of the battery temperature as a variable.

In the above described life determining apparatus according to the present invention, the expected life value can be optimized as needed by calculating the remaining life value from the non-periodical expected life value, the first life reduction amount, and the second life reduction amount, as a result of which the accuracy of the remaining life value can be further improved.

The above described life determining apparatus according to the present invention, can be made to function as a more efficient system by integrating each means of the life determining part with the battery, or by additionally providing means for displaying the remaining life value, means for communicating the remaining life value, or means for controlling the charging of the battery on the basis of the remaining life value.

Effect of the Invention

The life determining method and apparatus of a nickel-hydride battery according to the present invention is capable of precisely and accurately determine the life of a nickel-hydride battery incorporated in an uninterruptible power supply, even in the case where the discharge power, the discharge frequency, the battery temperature and the like are different.

BEST MODE FOR CARRYING OUT THE INVENTION

In the following, embodiments according to the present invention will be described with reference to the accompanying drawings. Note that the present invention can be practiced with proper modification without departing from the scope of the invention.

Figure 1:
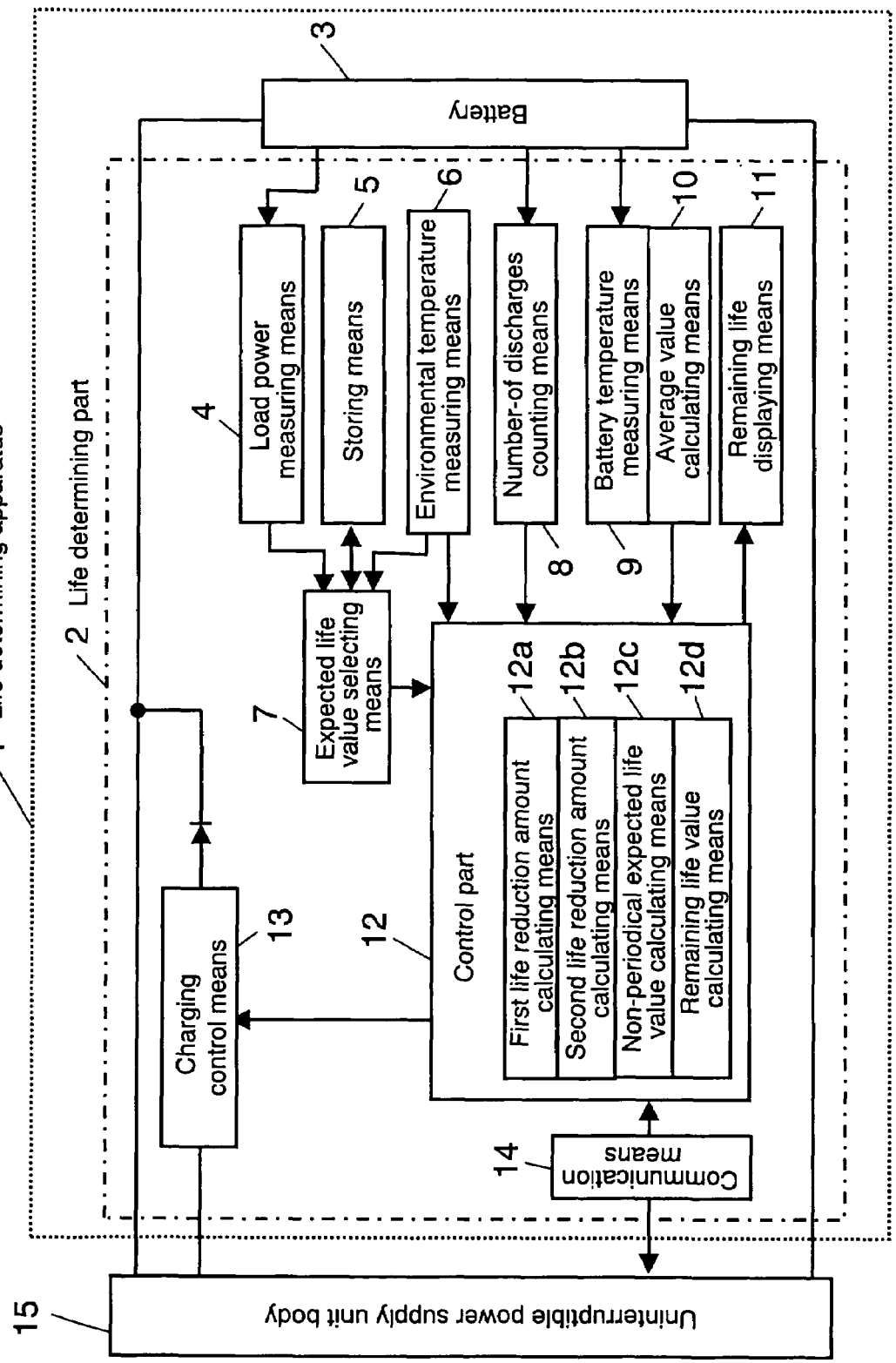
FIG. 1 is a block diagram showing a life determining apparatus of a nickel-hydride battery according to the present invention.

FIG. 1 is a block diagram showing a life determining apparatus according to the present invention. In FIG. 1, a life determining apparatus 1 is constituted of a life determining part 2 and a nickel-hydride battery 3 incorporated in an uninterruptible power supply.

In the life determining part 2, there are incorporated: load power measuring means 4 which measures a value of load power; storing means 5 which stores data of a relationship between load power and battery life obtained beforehand at a fixed interval of environmental temperature in the form of a load power-battery life table; environmental temperature measuring means 6 which measures an environmental temperature of a place where the battery 3 is installed; expected life value calculating means 7 which selects an expected life value from the life data stored in the storing means 5 on the basis of the load power measured by the load power measuring means 4, and the environmental temperature measured by the environmental temperature measuring means 6; number-of-discharges counting means 8 which counts the number-of-discharges of the battery 3; battery temperature measuring means 9 which measures battery temperatures at a fixed time interval; average value calculating means 10 which calculates an average value by dividing the sum of the battery temperatures measured by the battery temperature measuring means 9 by the number of times of the measurements; remaining life displaying means 11 which displays a remaining life; a control part 12; charging control means 13; and communication means 14.

The control part 12 comprises: first life reduction amount calculating means 12a which converts information from the number-of-discharges counting means 6 counting the number-of-discharges to a life reduction amount; second life reduction amount calculating means 12b which converts the average value of battery temperature obtained by the average value calculating means 10 and information from the number-of-discharges measuring means 8 to a life reduction amount; non-periodical expected life value calculating means 12c which calculates a non-periodical expected life value by adding the information from the average value calculating means 10 to an initial expected life value read from the storing means 5; and remaining life value calculating means 12d. Note that reference numeral 15 denotes an uninterruptible power supply unit body.

Next, each life determining method according to the present invention which uses the above described life determining apparatus will be specifically explained on the basis of a flow chart.

Embodiment 1

Figure 2:
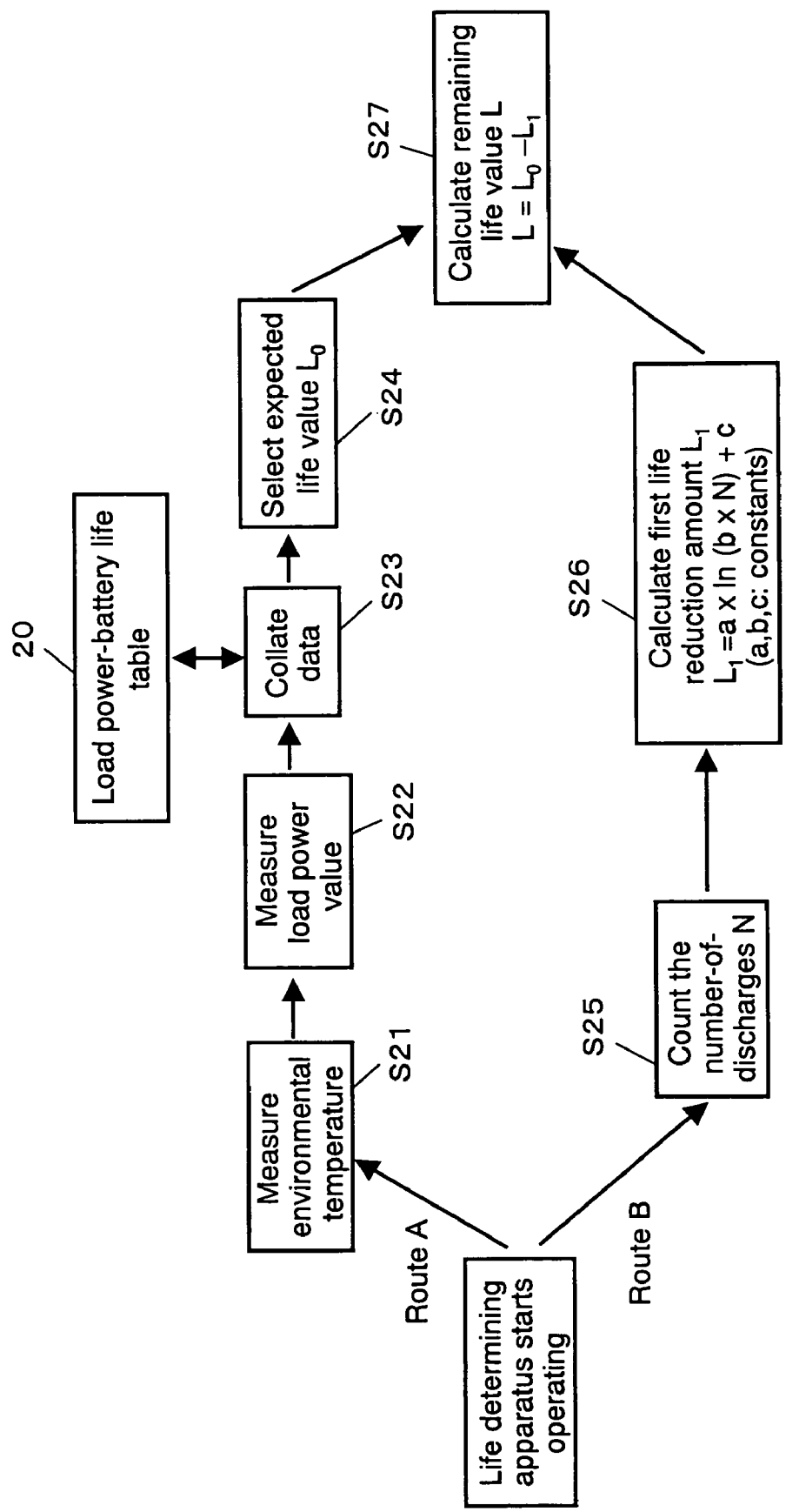
FIG. 2 is a flow chart showing a life determining method of a nickel-hydride battery in an embodiment 1 according to the present invention.

FIG. 2 is a flow chart showing a first life determining method according to the present invention.

When the nickel-hydride battery 3 incorporated in the uninterruptible power supply starts to discharge, the life determining apparatus 1 starts operating, so that an operation (route A) to obtain an initial expected life value $L_0$, and an operation (route B) to obtain a first life reduction amount $L_1$ are started.

The operation of route A is explained. A relationship between load power applied to the battery in discharge and battery life is obtained beforehand at each fixed interval of environmental temperature, and data of the relationship are stored as a load power-battery life table 20 in the storing means 5 such as a memory.

First, an environmental temperature $T_0$ of a place where the battery 3 is installed is measured by the environmental temperature measuring means 6 (step S21), and then a load power value is measured by the load power measuring means 4 (S22). Normally, a load power value is expressed by a time rate of discharge current representing a discharge rate.

Next, the measured value of load power is collated with a value of the load power-battery life table 20 stored in the storing means 5 (S23), and an expected life value $L_0$ corresponding to the load power value is obtained from a table closest to the environmental temperature measured in S21. Then the obtained expected life value $L_0$ is outputted to the control part 12 (S24).

Next, the operation of route B is explained. The number-of-discharges N of the battery 3 is obtained by the number-of-discharges counting means 6 (S25). The value N is outputted to the control part 12, and a first life reduction amount $L_1$, is obtained as a natural logarithmic function with the number-of-discharges N as a variable by the formula (1) in the first life reduction amount calculating means 12a, and outputted (S26). Then, on the basis of the initial expected life value $L_0$ and the first life reduction amount $L_1$ which are obtained, the remaining life value L is calculated by the formula (2) in the remaining life value calculating means 12d (S27).

The remaining life value L obtained in this way is outputted to the remaining life displaying means 11 from the control part 12, so as to inform a user of the remaining life by lighting LED and the like, by display on a display and the like, or by emitting a sound and the like. The remaining life value L is further sent to the uninterruptible power supply unit body 15 by the communication means 14, so that the charging of the nickel-hydride battery 3 which is currently discharged is controlled by the charging control means 13.

Note that since the nickel-hydride battery is generally installed in a place where the battery is hardly seen by the user, it is effective to provide the remaining life displaying means 11 in a part which can be easily seen by the user similarly to the control part of the uninterruptible power supply unit body.

Embodiment 2

Figure 3:
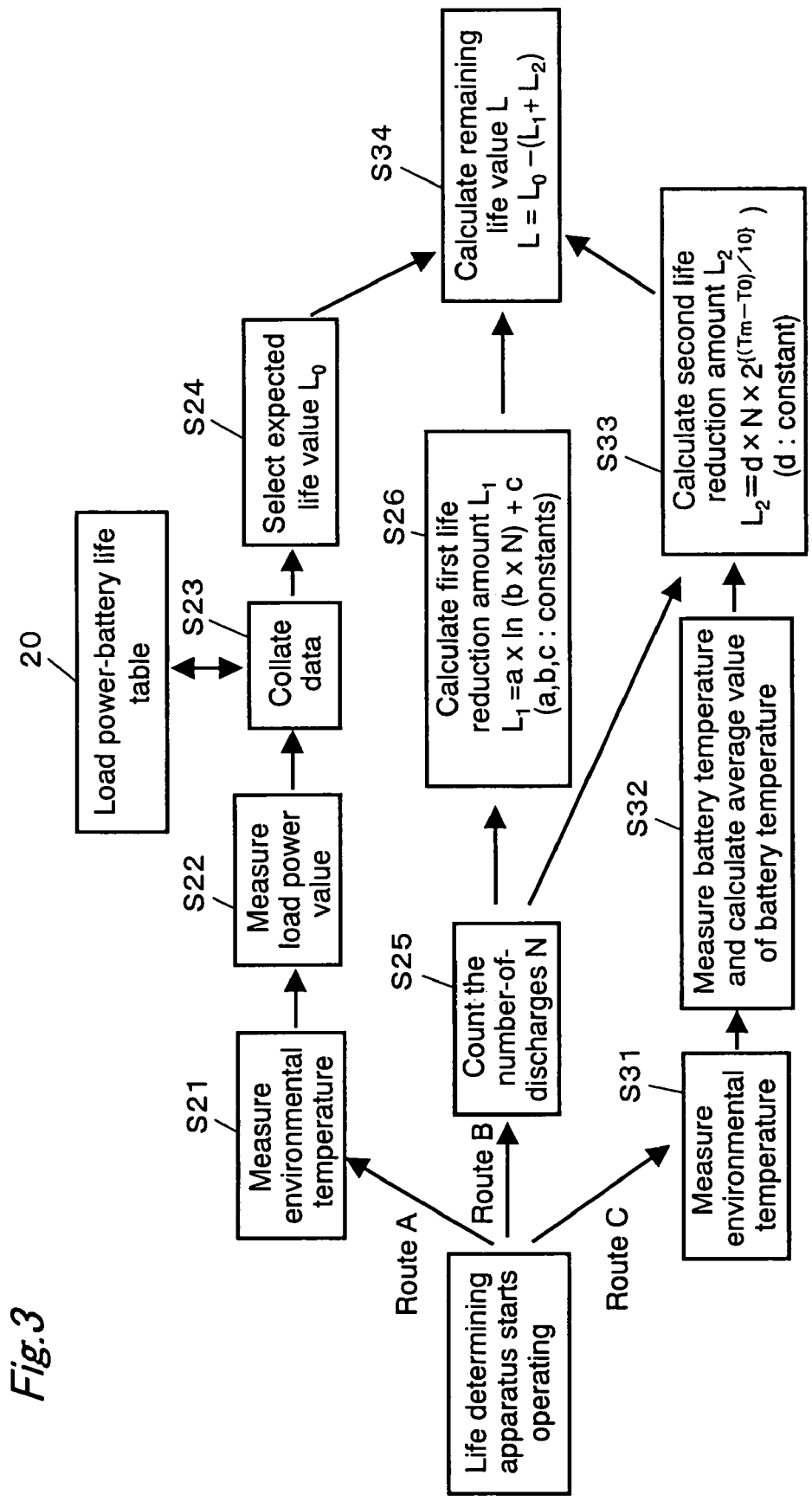
FIG. 3 is a flow chart showing a life determining method of a nickel-hydride battery in an embodiment 2 according to the present invention.

FIG. 3 is a flow chart showing a second life determining method according to the present invention.

In the second life determining method according to the present invention, an operation of route C is added to the operation of routes A, B explained in the first life determining method. In the operation of route C, similarly to the route A, an environmental temperature $T_0$ is first measured by the environmental temperature measuring means 6 (S31), and the battery temperature is measured at every fixed time interval by the battery temperature measuring means 9. Thereafter, an average value $T_m$ of the battery temperature is calculated in the average value calculating means 10 (S32). A second life reduction amount $L_2$ is calculated by the formula (3) using the average value $T_m$ of battery temperature, the environmental temperature $T_0$, and the number-of-discharges N already measured in S25 in the route B (S33). Then, on the basis of the expected life value $L_0$, the first life reduction amount $L_1$, and the second life reduction amount $L_2$ which are obtained, a remaining life value L is calculated by the formula (4) in the remaining life value calculating means 12d (S34). The succeeding processing is similar to that of the first embodiment, and hence the explanation thereof is omitted.

Embodiment 3

Figure 4:
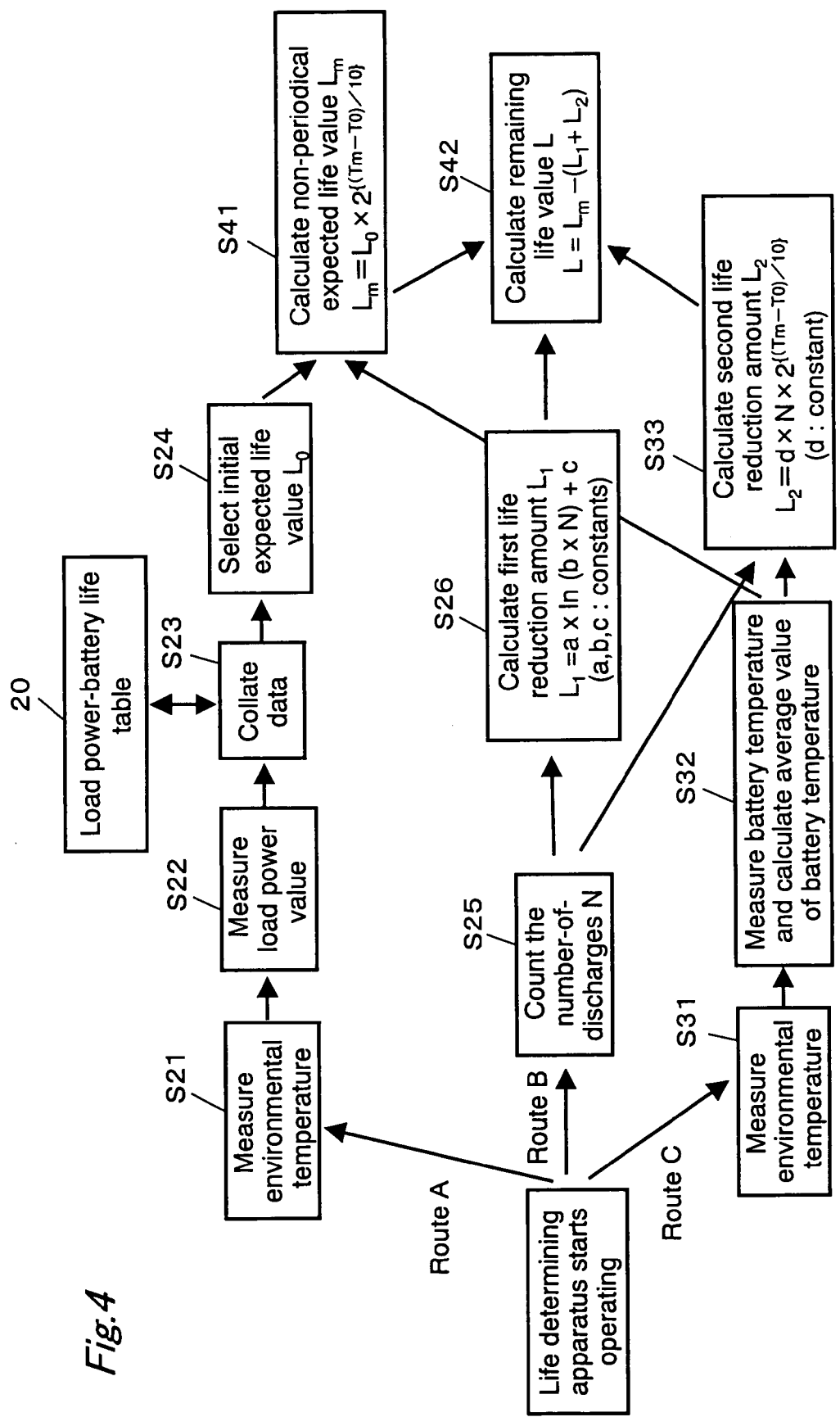
FIG. 4 is a flow chart showing a life determining method of a nickel-hydride battery in an embodiment 3 according to the present invention.

FIG. 4 is a flow chart showing a third life determining method according to the present invention.

In the third life determining method, the operation up to the step (S24) which calculates the initial expected life value $L_0$ in the operation of route A is the same as the operation in the first and second life determining methods, but the following operation is different from the operation in the first and second life determining methods. Specifically, the non-periodical expected life value calculating means 12c calculates a non-periodical expected life value $L_m$ from the formula (5) using the environmental temperature $T_0$ measured in S21, and the average value $T_m$ of battery temperature calculated in S32 of the route C (S41). Then, in the remaining life value calculating means 12d, a remaining life value L is calculated to determine the life of the nickel-hydride battery by subtracting the first life reduction amount $L_1$ and the second life reduction amount $L_2$ from the obtained non-periodical expected life value $L_m$ (S42). The succeeding processing is similar to that of the embodiment 1.

Next, in relation to the above described life determining method according to the present invention, examples in which the remaining life value is calculated under various conditions on the basis of each of the above described formulas, are explained.

EXAMPLE 1

A positive electrode formed by filling spherical nickel hydroxide powder into three-dimensional porous nickel and a negative electrode formed by applying hydrogen storage alloy powder to a nickel plated punching metal are combined so as to make their theoretical capacity ratio to ½ (the ratio of the negative electrode to the positive electrode is set to 2). Then, the electrodes are wound with a separator made of a sulfonated polypropylene nonwoven fabric so that an electrode group is formed. This electrode group is inserted into a nickel plated cylindrical iron can. After an electrolyte consisting of an aqueous solution of KOH and NaOH is poured into the can, the opening of the can is sealed with a sealing plate and a gasket. In this way, a cylindrical nickel-hydride battery A having a diameter of 17 mm, a height of 50 mm, a separator thickness of 0.18 mm and the nominal capacity of 1800 mAh is produced.

This battery A is incorporated in the life determining apparatus shown in FIG. 1. Then, after the nickel-hydride battery integrated with the life determining apparatus is subjected to a sufficient number of initial activation cycles, the following charge and discharge test for the battery is performed under an atmosphere at 40° C. The expected life value (initial expected life value) $L_0$ is calculated in comparison with the life information of the battery extracted beforehand from the relationship between the environmental temperature and the discharge current value.

Charge at 900 mA, stop the charge at the voltage drop of 5 mV from the maximum achievable voltage (so-called, $-\Delta V$ control system), and pause for 3 days.

The above charge and pause cycle is repeated, and the discharge is performed at the discharge current of 1800 mA to a voltage of 1.0 V once for every ten cycles. At each point of time when the discharge is repeated 10 times, 30 times and 50 times, the remaining life value L is calculated on the basis of the flow chart shown in FIG. 2. In the life determining apparatus, the end of the life of the nickel-hydride battery is determined at the point of time when the remaining capacity of the battery reaches 1080 mAh (60% of the nominal capacity).

The expected life value $L_0$, the environmental temperature and the discharge rate (represented by a time rate) which are used at the time of calculating the expected life value $L_0$, and values of the constants a, b, c in the formula (1) used for life determination are shown in No. 1 in Table 1. The calculation result of the remaining life value is shown in No. 1 of Table 2.

EXAMPLE 2

With the life determining apparatus in the example 1, the discharge rate is changed to the time rate×5 and the time rate×0.5, so that the remaining life value L is calculated on the basis of the flow chart shown in FIG. 2. The condition for calculating the expected life value $L_0$ and values of the constant a, b, c are shown in Nos. 2 and 3 of Table 1, and the calculation results of the remaining life value L is shown in Nos. 2 and 3 of Table 2, respectively.

COMPARATIVE EXAMPLE 1

With the life determining apparatus and the battery of the example 1, the remaining life value is calculated under the same conditions as the examples 1, 2 by using a linear function ($L=L_0-N$) instead of the formulas (1) and (2). The conditions for calculating the remaining life value and the calculation results are shown in Nos. 9 to 11 of Tables 1 and 2, respectively.

EXAMPLE 3

With the life determining apparatus and the battery of the example 1, the remaining life value L is calculated on the basis of the flow chart shown in FIG. 3 by using the formulas (3), (4). The condition including the value of the constant d in the formula (3) for calculating the remaining life value and the calculation result are shown in No. 4 of Tables 1 and 2, respectively.

EXAMPLE 4

With the life determining apparatus and the battery of the example 1, the remaining life value L is calculated on the basis of the flow chart shown in FIG. 4 by using the formulas (5), (6). The condition for calculating the remaining life value and the calculation result are shown in No. 5 of Tables 1 and 2, respectively. Note that the average value $T_m$ of the battery temperature is shown in Table 2.

EXAMPLE 5

With the life determining apparatus and the battery of the example 1, the remaining life value is calculated under the same condition as the example 1 except that the environmental temperature is changed to 35° C. The condition for calculating the remaining life value and the calculation result are shown in No. 6 of Tables 1 and 2, respectively.

COMPARATIVE EXAMPLE 2

With the life determining apparatus and the battery of the example 5, the remaining life value is calculated by using the linear function ($L=L_0-N$). The condition for calculating the remaining life value and the calculation result are shown in No. 12 of Tables 1 and 2, respectively.

EXAMPLE 6

A cylindrical nickel-hydride battery B having the same constitution as that of the example 1 except that the thickness of separator is 0.18 mm and the nominal capacity is 1600 mAh, and a cylindrical nickel-hydride battery C having the same constitution as that of the example 1 except that the thickness of separator is 0.26 mm and the nominal capacity is 1400 mAh, are produced. The remaining life values of these batteries are calculated under the same condition as that of the example 1. The condition for calculating the remaining life value and the calculation results are shown in Nos. 7 and 8 of Tables 1 and 2.

COMPARATIVE EXAMPLE 3

With the life determining apparatus and the battery of the example 6, the remaining life value is calculated by using the linear function ($L=L_0-N$). The condition for calculating the remaining life value and the calculation result are shown in Nos. 13 and 14 of Tables 1 and 2.

TABLE 1

| No. | Battery | Environmental temperature (° C.) | Time rate (×) | $L_0$ (Cycle) | Formula for determination | a | b | c | d |
|---|---|---|---|---|---|---|---|---|---|
| 1 | A | 40 | 1 | 60 | (Formulas 1, 2) | 10.9 | 0.05 | −0.11 | — |
| 2 | A | 40 | 5 | 72 | (Formulas 1, 2) | 10.9 | 0.05 | −0.11 | — |
| 3 | A | 40 | 0.5 | 40 | (Formulas 1, 2) | 10.9 | 0.05 | −0.11 | — |
| 4 | A | 40 | 1 | 60 | (Formulas 3, 4) | 10.9 | 0.05 | −0.11 | 0.14 |
| 5 | A | 40 | 1 | 60 | (Formulas 5, 6) | 10.9 | 0.05 | −0.11 | 0.14 |
| 6 | A | 35 | 1 | 85 | (Formulas 1, 2) | 10.9 | 0.05 | −0.11 | — |
| 7 | B | 40 | 1 | 73 | (Formulas 1, 2) | 12.1 | 0.09 | −0.11 | — |
| 8 | C | 40 | 1 | 90 | (Formulas 1, 2) | 15.2 | 0.22 | −0.11 | — |
| 9 | A | 40 | 1 | 60 | $L_0 - N$ | — | — | — | — |
| 10 | A | 40 | 5 | 72 | $L_0 - N$ | — | — | — | — |
| 11 | A | 40 | 0.5 | 40 | $L_0 - N$ | — | — | — | — |

TABLE 1-continued

| No. | Battery | Environmental temperature (° C.) | Time rate (x) | $L_0$ (Cycle) | Formula for determination | a | b | c | d |
|---|---|---|---|---|---|---|---|---|---|
| 12 | A | 35 | 1 | 85 | $L_0 - N$ | — | — | — | — |
| 13 | B | 40 | 1 | 73 | $L_0 - N$ | — | — | — | — |
| 14 | C | 40 | 1 | 90 | $L_0 - N$ | — | — | — | — |

The deviation of the remaining life values L obtained in each of the examples and the comparative examples as described above from the actually measured values are shown by the number of cycles for each number-of-discharges N in Table 2.

battery is constituted so as to make the negative electrode theoretical capacity twice the positive electrode theoretical capacity, and thereby the life deterioration speed of the battery greatly deviates from the linear function to get closer to the natural logarithmic function.

TABLE 2

| | N = 10 | | | | | | N = 30 | | | |
|---|---|---|---|---|---|---|---|---|---|---|
| No. | $L_1$ (Cycle) | $T_m$ (° C.) | $L_2$ (Cycle) | $L_m$ (Cycle) | L (Cycle) | Deviation (Cycle) | $L_1$ (Cycle) | $T_m$ (° C.) | $L_2$ (Cycle) | $L_m$ (Cycle) |
| 1 | −8 | — | — | — | 68 | −12 | 4 | — | — | — |
| 2 | −8 | — | — | — | 80 | −12 | 4 | — | — | — |
| 3 | −8 | — | — | — | 48 | −23 | 4 | — | — | — |
| 4 | −8 | 40 | 1 | — | 67 | −13 | 4 | 40 | 4 | — |
| 5 | −8 | 40 | 1 | 60 | 67 | −13 | 4 | 40 | 4 | 60 |
| 6 | −8 | — | — | — | 93 | −7 | 4 | — | — | — |
| 7 | −1 | — | — | — | 74 | −14 | 12 | — | — | — |
| 8 | 12 | — | — | — | 78 | −22 | 29 | — | — | — |
| 9 | — | — | — | — | 50 | −30 | — | — | — | — |
| 10 | — | — | — | — | 62 | −30 | — | — | — | — |
| 11 | — | — | — | — | 30 | −41 | — | — | — | — |
| 12 | — | — | — | — | 75 | −25 | — | — | — | — |
| 13 | — | — | — | — | 63 | −25 | — | — | — | — |
| 14 | — | — | — | — | 80 | −20 | — | — | — | — |

| | N = 30 | | N = 50 | | | | | | Actually measured |
|---|---|---|---|---|---|---|---|---|---|
| No. | L (Cycle) | Deviation (Cycle) | $L_1$ (Cycle) | $T_m$ (° C.) | $L_2$ (Cycle) | $L_m$ (Cycle) | L (Cycle) | Deviation (Cycle) | value (Cycle) |
| 1 | 56 | −4 | 10 | — | — | — | 50 | 10 | 90 |
| 2 | 68 | −4 | 10 | — | — | — | 62 | 10 | 102 |
| 3 | 36 | −15 | 10 | — | — | — | 30 | −1 | 81 |
| 4 | 52 | −8 | 10 | 41 | 8 | — | 42 | 2 | 90 |
| 5 | 52 | −8 | 10 | 41 | 8 | 56 | 38 | −2 | 90 |
| 6 | 81 | 1 | 10 | — | — | — | 75 | 15 | 110 |
| 7 | 61 | −7 | 18 | — | — | — | 55 | 7 | 98 |
| 8 | 61 | −19 | 36 | — | — | — | 54 | −6 | 110 |
| 9 | 30 | −30 | — | — | — | — | 10 | −30 | 90 |
| 10 | 42 | −30 | — | — | — | — | 22 | −30 | 102 |
| 11 | 10 | −41 | — | — | — | — | −10 | −41 | 81 |
| 12 | 55 | −25 | — | — | — | — | 35 | −25 | 110 |
| 13 | 43 | −25 | — | — | — | — | 23 | −25 | 98 |
| 14 | 60 | −20 | — | — | — | — | 40 | −20 | 110 |

It can be seen from Table 2 that the deviation of the values of the comparative examples shown in Nos. 9 to 14 from the actually measured values is significant, while the deviation of the values of the examples shown in Nos. 1 to 8 from the actually measured values is small. This tendency is more significant as the number-of-discharges N is increased. As a reason for this tendency, it is considered that corrosion of the hydrogen storage alloy is settled by the repetition of the cycles and thereby can be approximated by a natural logarithmic function.

Specifically, in the case of the present embodiment, this tendency is considered to be influenced by the fact that the Also, as a reason for the fact that the determination results in Nos. 4 and 5 are more accurate than those in Nos. 1 to 3 as the number-of-discharges N is increased, it is considered that the heat generation resulting from charge and discharge and the change of environmental temperature can be more easily taken into account.

In the present embodiment, a metallic battery can with relatively high heat dissipating characteristic is used, but in the case where a battery case made of a resin with relatively low heat dissipating characteristic, the effect of determination based on the formulas (3), (4) and the formulas (5), (6) is considered to become more remarkable.

Further, in the present embodiment, the intermittent charging based on the −ΔV control system is selected as the battery charging method, but substantially the same effect can also be obtained even when the intermittent charging based such as on the dT/dt control system which is a temperature control system and on the timer control system is performed, or when the trickle charging is performed.

INDUSTRIAL APPLICABILITY

The life determining method and apparatus according to the present invention are useful in the life determining method of a nickel-hydride battery used for example for an uninterruptible power supply and the like, and in the life determining apparatus using the method.

The invention claimed is:

1. A life determining method of a nickel-hydride battery, comprising the steps of:
   (a) preparing beforehand data representing a relationship of life of the battery to load power of the battery in discharge and environmental temperature of a place where the battery is installed;
   (b) measuring the load power and the environmental temperature of the battery in discharge;
   (c) selecting a life value corresponding to the measured values of the load power and the environmental temperature from the data to set the life value as an expected life value;
   (d) calculating a first life reduction amount from a natural logarithmic function with the number-of-discharges of the battery as a variable; and
   (e) setting a value obtained by subtracting the first life reduction amount from the expected life value to a remaining life value.

2. A life determining apparatus of a nickel-hydride battery, comprising:
   storing means which stores data indicating a relationship of life of the battery to load power applied to the battery in discharge and environmental temperature in a place where the battery is installed;
   load power measuring means which measures the load power applied to the battery;
   environmental temperature measuring means which measures the environmental temperature;
   expected life value selecting means which selects a life value corresponding to the load power measured by the load power measuring means and the environmental temperature measured by the environmental temperature measuring means, from the data stored in the storing means as an expected life value;
   number-of-discharges counting means which counts the number-of-discharges of the battery;
   first life reduction amount calculating means which calculates a first life reduction amount from a natural logarithmic function with the number-of-discharges counted by the number-of-discharges counting means as a variable; and
   remaining life value calculating means which calculates a remaining life value from the expected life value selected by the expected life value selecting means and the first life reduction amount calculated by the first life reduction amount calculating means.

3. The life determining apparatus of a nickel-hydride battery according to claim 2, wherein each of the means is integrally provided for the battery.

4. The life determining apparatus of a nickel-hydride battery according to claim 2, further comprising means for displaying the remaining life value.

5. The life determining apparatus of a nickel-hydride battery according to claim 2, further comprising means for communicating the remaining life value.

6. The life determining apparatus of a nickel-hydride battery according to claim 2, further comprising means for controlling charge of the battery on the basis of the remaining life value.

* * * * *